United States Patent [19]

Schubert et al.

[11] Patent Number: 4,716,128
[45] Date of Patent: Dec. 29, 1987

[54] METHOD OF FABRICATING SILICON-ON-INSULATOR LIKE DEVICES

[75] Inventors: Peter J. Schubert; Nadeem S. Alvi, both of Kokomo, Ind.

[73] Assignee: General Motors Corporation, Detroit, Mich.

[21] Appl. No.: 940,255

[22] Filed: Dec. 10, 1986

[51] Int. Cl.$^4$ .................. H01L 21/365; H01L 41/425
[52] U.S. Cl. ....................................... 437/41; 437/200
[58] Field of Search ................. 29/571, 576 B, 576 E, 29/578; 148/175

[56] References Cited

U.S. PATENT DOCUMENTS

| | | | |
|---|---|---|---|
| 4,402,761 | 9/1983 | Feist | 29/576 B |
| 4,404,732 | 9/1983 | Andrade | 29/571 |
| 4,419,811 | 12/1983 | Rice | 29/578 Y |
| 4,494,304 | 1/1985 | Yoshioka | 29/576 W X |
| 4,523,213 | 6/1985 | Konaka et al. | 357/23.7 |
| 4,530,149 | 7/1985 | Jastrzebski et al. | 29/576 E X |

FOREIGN PATENT DOCUMENTS 81104511.1 11/1981 European Pat. Off. .

OTHER PUBLICATIONS

"A Bird's Beak Free Local Oxidation Technology Feasible for VSLI Circuits Fabrication," Kuang Yi Chiu et al., IEEE Transactions on Electron Devices, vol. ED-29, No. 4, Apr. 1982, pp. 536–540.
"Alternatives to LOCOS Could Aid Isolation Technology," Semiconductor International, Mar. 1984, pp. 19 and 20.
"Selective Low-Pressure Silicon Epitaxy for MOS and Bipolar Transistor Application," Hans Kurten et al., IEEE Transactions on Electron Devices, vol. ED-30, No. 11, Nov. 1983, pp. 1511–1515.
"The Sloped-Wall SWAMI—A Defect-Free Zero Bird's-Beak Local Oxidation Process for Scaled VLSI Technology," Kuang Y. Chiu et al., IEEE Transactions on Electron Devices, vol. ED-30, No. 11, Nov. 1983, pp. 1506–1511.
"Development of the Self-Aligned Titanium Silicide Process for VLSI Applications," Michael E. Alperin et al., IEEE Journal of Solid-State Circuits, vol. SC-20, No. 1, Feb. 1985, pp. 61–69.

Primary Examiner—George T. Ozaki
Attorney, Agent, or Firm—Robert J. Wallace

[57] ABSTRACT

A process for forming MOS transistors in which the source and drain regions essentially interface only the channel portion of the silicon substrate to keep parasitic capacitances low. To this end, a monocrystalline silicon substrate has one major planar surface covered with a layer of silicon oxide and a hole formed in the oxide layer of a size suited for the channel of the transistor. Then silicon is epitaxially grown vertically to fill the hole. The grown silicon is then covered. Next, portions of the oxide layer are removed to expose a pair of opposed vertical sidewalls of the vertically grown silicon and silicon is epitaxially grown laterally out of said exposed sidewalls. Such laterally grown regions serve as the source and drain of the transistor and an upper portion of the vertically grown silicon serves as the channel. A gate oxide is grown over a top portion of the vertically grown silicon and a polysilicon gate region is formed over the gate oxide. The gate region then serves as a mask which allows the laterally grown drain and source regions to be doped and to be self-aligned to the gate region.

9 Claims, 16 Drawing Figures

METHOD OF FABRICATING SILICON-ON-INSULATOR LIKE DEVICES

FIELD OF INVENTION

This invention relates to methods of fabrication of silicon devices which have relatively low parasitic capacitance.

CROSS REFERENCE

This application is related to three other United States patent applications which are being filed concurrently with the present application and in which there is one common inventor and a common assignee. They are Ser. No. 940,436 entitled "Semiconductor Mushroom Structure Fabrication" Christenson and Schubert filed on Dec. 11, 1986; Ser. No. 939,183 entitled "Method of Fabricating Self-Aligned Silicon-on-Insulator Like Devices"; and Ser. No. 939,078 entitled "Double-Self-Aligned Hole-Within-a-Hole Structure in Semiconductor Fabrication"; by Schubert on Dec. 8, 1986.

BACKGROUND OF THE INVENTION

The importance of keeping parasitic capacitances low in MOS transistors has long been recognized and the industry has expended considerable effort in developing fabrication processes which result in transistors with low values of parasitic capacitances.

There are two major possible sources of parasitic capacitances in an MOS transistor. One is the overlap of the gate electrode over the edges of the source and drain regions. This overlap typically is controlled by processes which use the gate region (electrode) as the implantation mask for controlling the critical edge of the ion-implanted regions formed for the source and drain. Such processes are generally described as self-aligned processes.

The other possible major source of parasitic capacitance is associated with the interface or junction between the localized source and drain regions and the silicon substrate in which they are formed. To control this source, it is known to form the source and drain regions in a semiconductive layer which has been formed on an insulating substrate. Such silicon-on-insulator structures tend to be expensive to make and to have operating problems, such as kink-effects, and so have had limited acceptance. Alternatives to such a structure include structures in which buried dielectric regions of either silicon oxide or silicon nitride extend partially around the source and drain regions to limit the parasitic capacitance of such regions. These fabrication processes also tend to be complex, particularly if adapted to utilize self-aligned source and drain regions.

One example of a silicon-on-insulator like transistor is the "mushroom" shaped Field Effect Transistor (FET) shown in Euopean Patent Application No. 81104511.1, filed Nov. 6, 1981. The "mushroom" shape is essentially a relatively narrow "stem" of silicon grown through an oxide layer and having a silicon "head", of larger lateral dimension than the "stem", grown on top of the oxide layer. When the "mushroom" shape is formed by growing silicon, first vertically and then laterally over a step in an oxide layer, the silicon grown over the step has a tendency to become polycrystalline. Field Effect Transistors (FETs) having polycrystalline channel regions typically have poorer performance than those with monocrystalline (single) silicon channel regions. The FETs can be Insulated Gate Field Effect Transistors (IGFETs) of the Metal-Oxide-Silicon (MOS) type or Junction Field Effect Transistors (J-FETs).

A buried insulating layer can be used to make a silicon-on-insulator like transistor structure. This is done by implantation of suitable ions, such as of oxygen or nitrogen, to convert the implanted region to an insulating silicon compound. Such techniques are difficult and do not yet appear to be commercially successful.

It would be desirable to have an economically viable process for producing a silicon-on-insulator like transistor structure which has relatively low drain and source to semiconductor body (substrate) capacitance and has an essentially monocrystalline silicon channel region that provides the performance of conventional transistor structures.

SUMMARY OF THE INVENTION

One embodiment of the present invention is directed to a process (method) that comprises the steps of forming an insulator over a surface of a semiconductor body that is to serve as the buried insulating layer and over which will extend source and drain regions of the final MOS transistor. Then an opening is formed through the layer of a dimension suitable for supporting a channel region of the transistor. Then semiconductor material is vertically grown substantially epitaxially to a sufficient thickness from the exposed semiconductor body surface portion and fills at least part of the opening. Then the insulator layer is patterned to expose a pair of opposed vertical sidewalls of the grown semiconductor material. Substantially epitaxial semiconductor material is grown laterally from such opposed walls over the underlying insulator layer to form a pair of opposed grown semiconductor regions suited to serve, after doping, as the source and drain of the transistor. There is then formed in any suitable fashion an MOS transistor using the initially vertically grown semiconductor material as the channel portion and the subsequently formed laterally grown semiconductor material as the source and drain. To this end a gate region is located over the top of the vertically grown silicon and used as an implantation mask for forming self-aligned source and drain regions in the laterally grown silicon. Known techniques are then used for providing electrical connections to the source, drain and gate regions as needed to permit the transistor to be interconnected into an integrated circuit.

In a preferred embodiment the semiconductor body is silicon, the insulator layers are silicon dioxide, and the gate region is formed from polycrystalline silicon.

In another embodiment the present invention is directed to a process (method) that comprises the steps of forming an insulator over a surface of a semiconductor body that is to serve as the buried insulating layer and over which will extend first and second regions of a semiconductor device. Then an opening is formed through the layer of a dimension suitable for supporting a third region of the device. Then semiconductor material is vertically grown substantially epitaxially from the exposed semiconductor body surface portion and fills at least part of the opening. Then the insulator layer is patterned to expose a pair of opposed vertical sidewalls of the grown semiconductor material. Substantially epitaxial semiconductor material is grown laterally from such opposed walls over the underlying insulator layer to form a pair of opposed grown semiconductor regions suited to serve as the first and second regions of the device. The first and second regions are separated by portions of the vertically grown semiconductor material which serve as the third region of the device.

The invention will be better understood from the subsequent more detailed description of an illustrative embodiment taken in conjunction with the accompanying drawings.

BRIEF DESCRIPTION OF THE DRAWINGS

FIGS. 1-16 show the work piece (structure) at various stages of its fabrication in accordance with the invention of which FIG. 5 is a perspective plan view and the remaining figures are sectional views. FIG. 4 is shown along the line 4—4 of FIG. 5. The remaining views are shown along the same plane but in other stages of manufacture.

Figure 1:
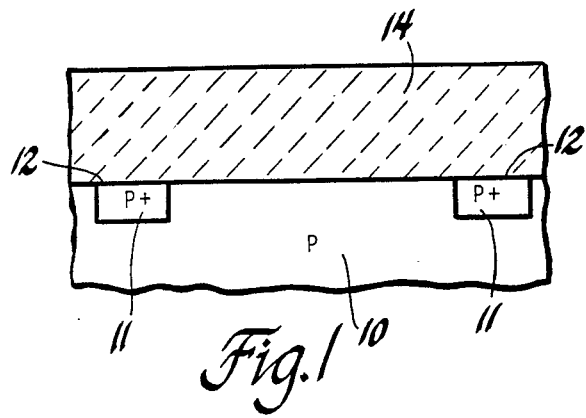

It is to be noted that the drawings are not to scale since the vertical dimensions generally are much smaller than the horizontal dimensions. To avoid confusion, no background lines are shown in the cross sectional views of the drawing.

Figure 5:
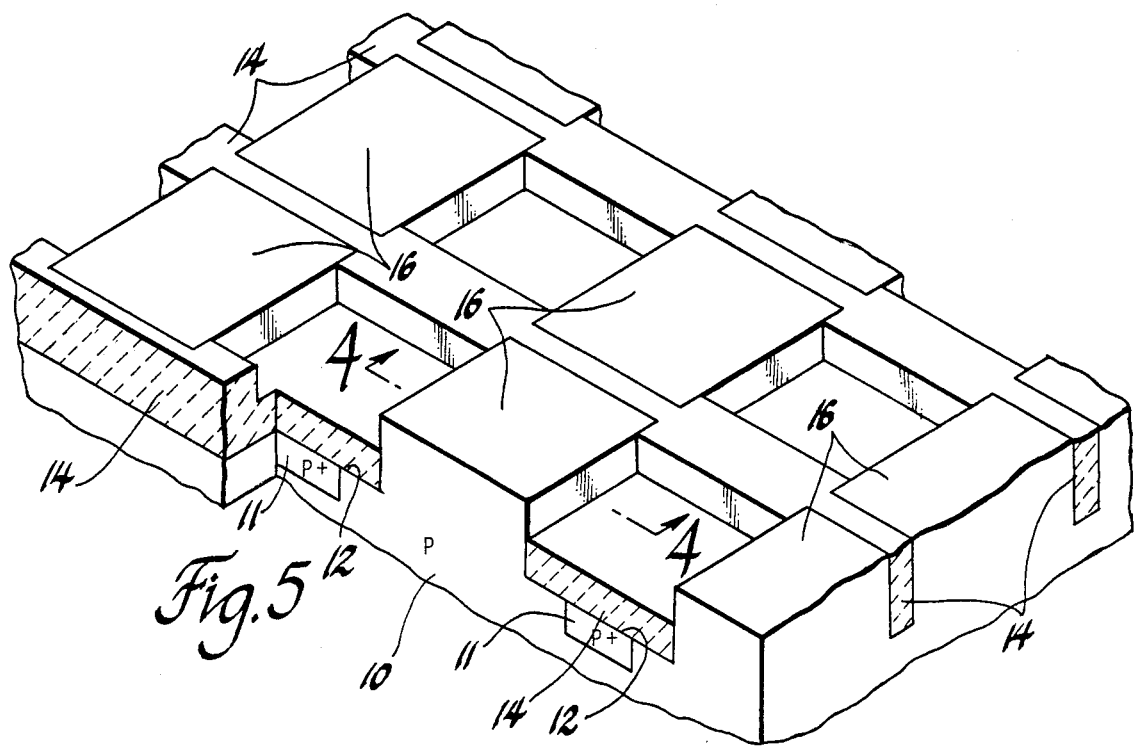

Moreover, although the method will be used to process a semiconductor substrate (chip) in which a large number of transistors will be formed in one sequence of steps, as shown in FIG. 5. However, for clarity the balance of the drawing, and the description, are generally limited to the fabrication of only a single transistor.

DETAILED DESCRIPTION

Referring now to FIG. 1, there is shown a cross-sectional view of a semiconductor body 10 having a surface 12 on which a relatively thick insulator layer 14 is formed. Semiconductor body 10 is typically monocrystalline silicon having a high resistivity and having a dopant concentration of about $1 \times 10^{15}$ atoms/per cubic centimeter. Body 10 may be of p or n type conductivity. In the specific example being described, it will be assumed that the doping of body 10 is p-type, as is characteristic of the more widely used n-channel MOS transistor, and that it is formed from (100) single crystal silicon. Before insulator layer 14 is formed, body 10 is masked and an ion implant of p-type impurities is selectively done so as to heavily dope (to approximately $1 \times 10^{18}$ to $1 \times 10^{19}$ atoms/per cubic centimeter) the portions 11 of body 10. This implant is used to increase the electrical isolation between transistors by preventing inversion of the implanted portions of body 10 as is known in the art. This is typically denoted as a field or channel stop implant. Insulator layer 14 is typically silicon dioxide which is typically 0.6 to 1.0 micron thick and may be thermally grown or deposited. Typically, surface 12 is planar and there will be formed hundreds or thousands or ten thousands of transistors and other devices. For the sake of convenience there will be illustrated the fabrication of a single transistor.

Figure 2:
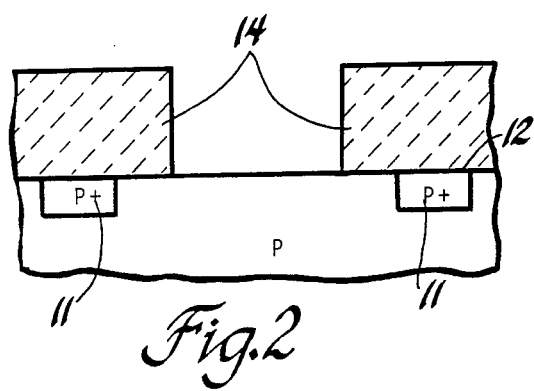

In FIG. 2 there is shown a hole (typically about 0.5 micron wide) through silicon dioxide layer 14 to surface 12 of silicon body 10. The width of this hole (the dimension in the plane of the paper) will determine the length of the channel (the separation between source and drain) of the transistor, so it is chosen appropriately. The dimension of the hole normal to the plane of the paper will control the maximum width of the channel, (the direction normal to the flow of carriers in the channel). This hole through silicon dioxide layer 14 is typically formed using well known photolithography masking techniques and anisotropic or trench etching techniques.

Figure 3:
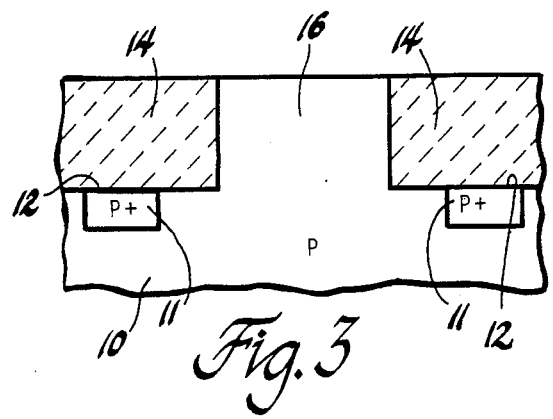

In FIG. 3 the hole in dioxide layer 14 is shown as having been filled with silicon so as to form a finger-like member 16 which advantageously extends to be essentially flush with or slightly below the top surface of silicon dioxide layer 14. A selective epitaxial deposition of silicon, which extends the single crystal silicon body up into the hole but does not deposit silicon firmly on exposed oxide surfaces, is used to form finger member 16. If necessary it is feasible to improve the crystalline nature by subsequent laser treatment as is known in the art.

Figure 4:
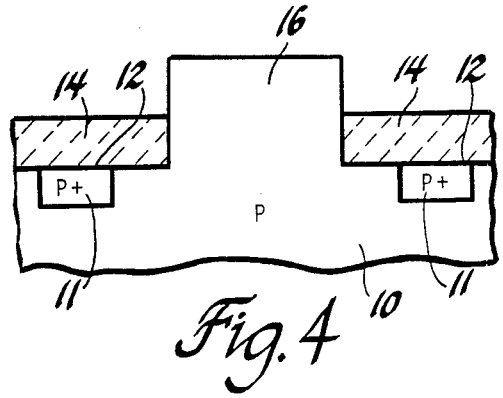

Then silicon dioxide layer 14 is masked, and partly removed on opposite sides but not the ends of finger 16 by selective anisotropic etching. This leaves a thickness of typically between 500 and 1000 Angstroms on either side of finger 16. The resulting structure is shown in FIG. 4. The anisotropic etching removes silicon dioxide from intermediate portions of two of the four sides of finger member 16. This etching step defines the width of the channel of the transistor to be formed and its distance from its nearest neighbor. FIG. 5 is a perspective view of part of an array of the FIG. 4 type of structures after this etching step is completed. It shows a portion of finger element 16 exposed along its sides in recesses in the surrounding oxide layer 14, as shown without background lines in FIG. 4. On the other hand, when empirically considering a single finger element 16, it can be considered to be as protruding above the lowered surface of the silicon dioxide layer 14 as shown without background lines in FIG. 4. However, its opposite ends are still enclosed within strips of the unetched silicon dioxide layer 14. These ends are then covered with silicon dioxide in the next step and left covered for the balance of the processing. It is desirable to leave end regions of the sidewalls unetched so that the silicon portions which will subsequently be laterally grown from these exposed sidewalls will have their two ends essentially capped with silicon oxide.

Figure 6:
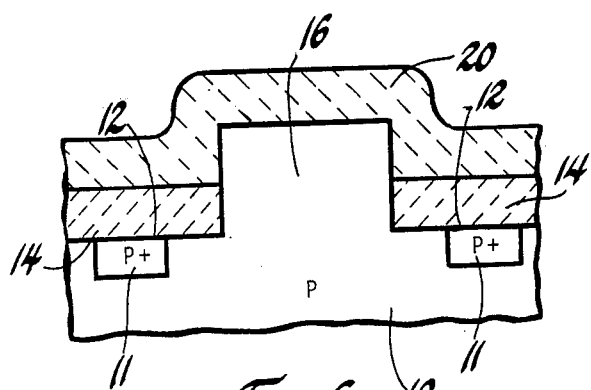

In FIG. 6 there is shown a conformal layer of silicon nitride 20 covering the entire exposed surfaces of finger member 16 and silicon dioxide layer 14. Layer 20 is typically deposited using well known chemical vapour deposition (CVD) techniques.

Figure 7:
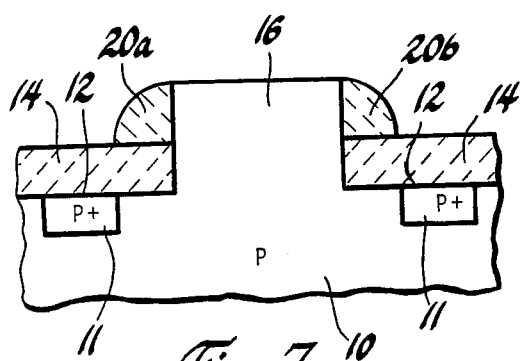

Conformal silicon nitride 20 layer is then etched in an anisotropic nitride etch so as to leave only the two curved portions of silicon nitride 20a and 20b butting up against the sidewalls of finger 16, as seen in FIG. 7. Use of a structure of this type is commonly known as the sidewall-spacer technique. The anisotropic etch is chosen to favor etching in the vertical direction as known in the art to achieve the result shown.

Figure 8:
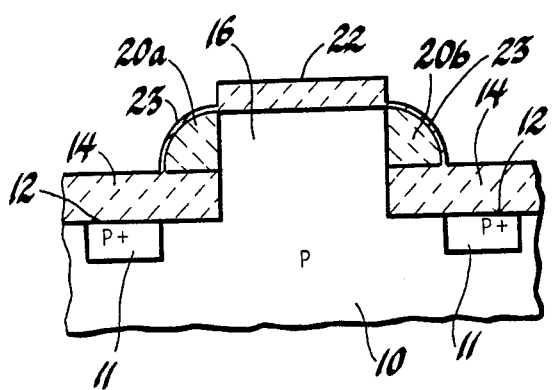

Then silicon dioxide is formed over the entire top of the resulting structure, typically by exposing the structure to a moderately high oxidizing temperature of approximately 950° C., for a sufficient time. This oxidation step grows oxide at different rates on silicon, silicon oxide, and silicon nitride so that different thickness layers of silicon dioxide will be grown on the exposed silicon, silicon nitride, and existing oxide. The exposed silicon oxidizes most rapidly and a relatively thicker layer 22 of silicon dioxide is formed over the silicon, as compared to the layer 23 over the nitride. The existing thick oxide layer 14 increases in thickness inconsequentially. The resultant is shown in FIG. 8.

Figure 9:
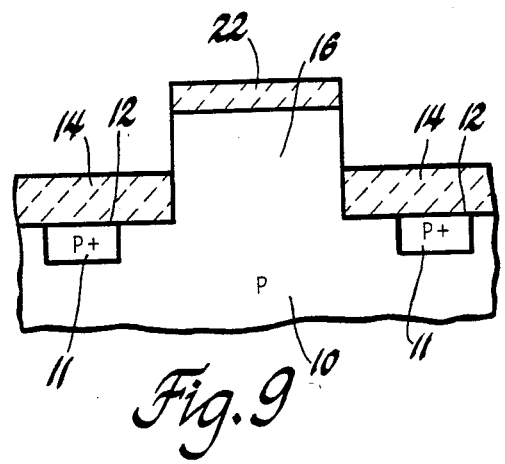

Then a short isotropic oxide etch is used to remove all of the silicon dioxide layer 23 leaving a portion of layer 22 over the top of the finger. A selective silicon nitride etch is then used to remove the nitride sidewall portions 20a and 20b. This leaves the top of finger 16, lower portions and the end portions of the opposed vertical sidewalls of finger 16, and semiconductor body 10 covered by silicon dioxide. The only exposed silicon is at the upper intermediate portions of the opposed vertical sidewalls of finger 16. The resultant is shown in FIG. 9.

Figure 10:
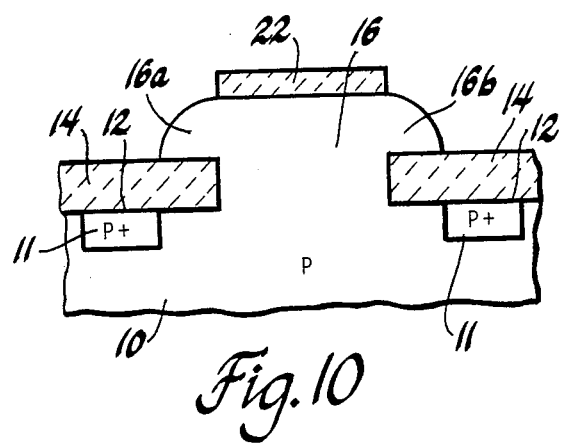

A lateral selective epitaxial silicon growth step is then performed to grow silicon substantially epitaxially only in the exposed areas of silicon. Silicon deposited elsewhere can readily be selectively removed. The regions of laterally grown silicon are shown as 16a and 16b in FIG. 10, on opposed sides of the upmost portion of silicon finger 16. Although high quality monocrystalline silicon is not required for such regions, if desired, the crystallinity can be improved by known laser techniques.

Figure 11:
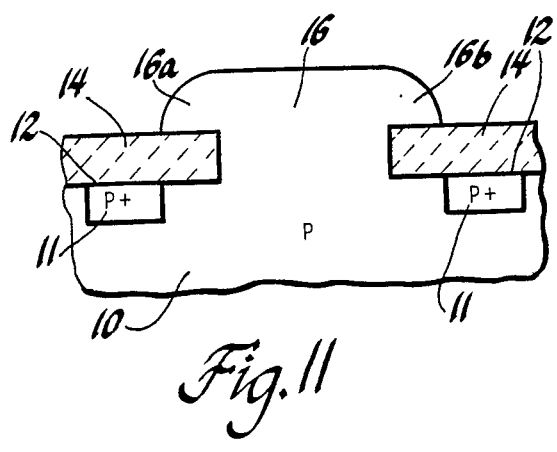

The layer of silicon dioxide 22 covering the top of finger 16 is then etched away to leave the structure of FIG. 11. This structure is clearly useful for the fabrication of insulated gate field effect transistors (IGFETs) in a variety of ways.

A preferred method of forming an MOS transistor from the structure shown in FIG. 11 will now be described in connection with the remaining figures.

Figure 12:
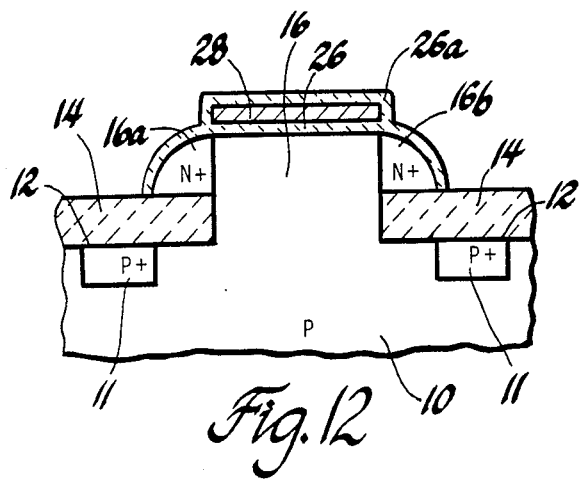

First, there is thermally grown in the usual fashion an oxide suitable for use as the gate 26 oxide over the exposed surface of the silicon protruding from the surrounding silicon dioxide corresponding to the tops of finger 16 and regions 16a and 16b. After the gate oxide 26 is grown, the structure is optionally implanted with appropriate ions to adjust the threshold voltage of the transistor in a known fashion, if such adjustment is desired. Next, a blanket layer of polycrystalline silicon suitable for use as the gate region (electrode) of the transistor is deposited over the top surface of the structure. After the blanket layer of polycrystalline silicon is deposited, the entire layer is doped heavily n-type ($1 \times 10^{20}$ atoms per cubic centimeter), such as from a phosphorus source at about 950° C. This layer is then patterned in the usual fashion to leave a portion, of the desired dimensions for the gate region (electrode) 28, over the central portion of the top surface, corresponding essentially to the original finger surface as is shown in FIG. 12.

This structure is then heated again in an oxidizing ambient to lightly oxidize the exposed surfaces of polycrystalline portion 28, and form a protective layer 26a, before subjecting the structure in a known fashion to high dosage implants of donor ions to dope regions 16a and 16b not covered by polysilicon gate portion 28 heavily n-type, so that they can serve as source and drain regions, respectively, of the n-channel IGFET formed at the top of the finger 16. The dopant concentrations of both of regions 16a and 16b is approximately $1 \times 10^{18}$ to $1 \times 10^{19}$ atoms per cubic centimeter. It should be noted that there results a self-aligned gate structure, as is generally desired. Moreover, the interface of the source and drain regions with the silicon is essentially limited to the channel portion of the transistor, thereby to achieve the low parasitic capacitance desired. The remainders of regions 16a and 16b are bounded by dielectric material (typically silicon dioxide). It is characteristic of the resulting transistor that its channel portion, which desirably should be of high quality monocrystalline silicon, was formed from material initially grown within the hole surrounded by silicon dioxide.

There remains to provide desired electrical connections to the source, drain and gate regions to permit connection of the transistor into an integrated circuit.

Figure 13:
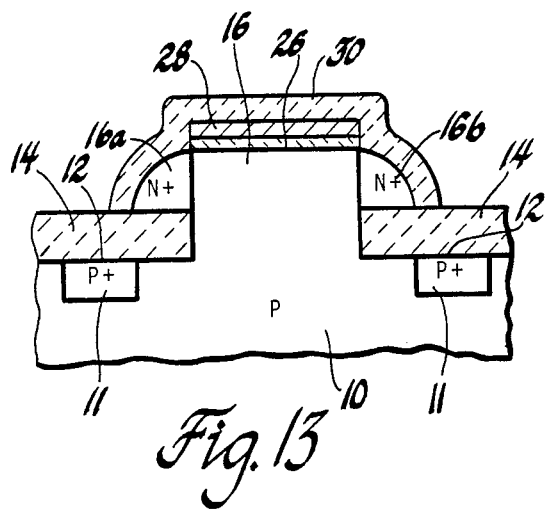

A variety of techniques are available for this purpose. A preferred technique involves initially removing the thin thermally grown oxide layer which remains over the top surface of the structure and then depositing a relatively thick conformal layer 30 of silicon dioxide by chemical vapor deposition over the entire top surface of the structure, as shown in FIG. 13.

Figure 14:
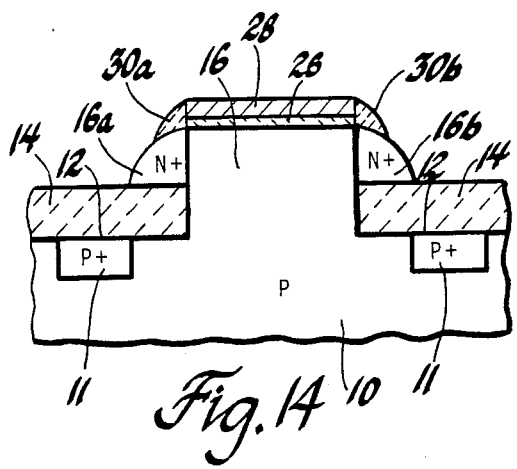

Then an anisotropic oxide etch leaves in place of the conformal layer 30 only the spacer portions 30a which are positioned along the sidewalls of the polycrystalline gate region (electrode) 28 and their junctions with the regions 16a and 16b as shown in FIG. 14.

Figure 15:
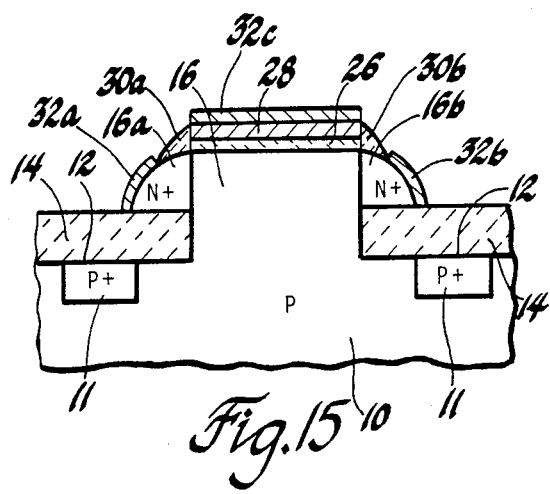

The resultant is then covered with a refractory metal, typically tungsten, titanium or tantalum, and then subjected to a rapid thermal anneal to convert the metal in contact with the silicon to a silicide but to leave unreacted the metal over the sidewall spacers 30a and 30b. This anneal also can serve to activate the ions earlier implanted into regions 16a and 16b. The unreacted metal can then be easily removed by a selective etch which little affects the silicide. The resultant is shown in FIG. 15 where a first part of the silicide layer 32c covers the top of the gate region 28, a second part of the silicide layer 32a covers surface portions of region 16a, and a third part of the silicide layer 32b cover surface portions of region 16b.

Figure 16:
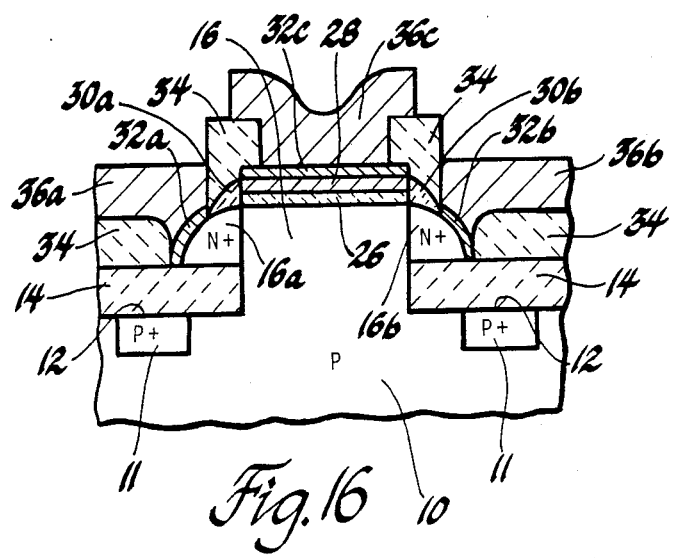

Then a phosphorus-rich glass layer 34 is deposited over the top surface of the structure and openings are formed in it wherever electrical contact is to be made to the transistor, i.e., the source, drain and gate regions. Standard techniques are available for this purpose. Then a layer of the contact metal, typically an aluminum-silicon alloy, is deposited over the glass to fill the via openings and this layer is patterned to provide the desired interconnection pattern between the transistors and any other devices (not shown) formed on or in body 10 as needed for an integrated circuit. This is shown in FIG. 16 where the glass layer 34 is shown provided with openings filled with the aluminum-silicon alloy to contact the silicide portions 32a, 32b, and 32c over the source region 16a, the drain region 16b, and the gate region 28, respectively. The aluminum-silicide alloy contacts to silicide regions 32a, 32b, and 32c are shown as 36a, 36b, and 36c, respectively. In some instances, two levels of metalization may be needed.

The above-described process (method) results in a Silicon-On-Insulator-Like (SOIL) IGFET. The advantages of a SOIL IGFET compared to a conventional IGFET are: 1. a reduction in the n-type drain and source to the p-type substrate area which means a reduction in parasitic capacitance, that increase radiation hardness and reduces leakage currents; 2. reduced isolation spacing between devices which increases packing density; 3. a reduction in spurious metal to substrate shorts; and 4. easier substrate biasing to eliminate "kink effects". The SOIL device of the present invention is also easier to fabricate than other known SOIL devices.

It is to be understood that the embodiment described is merely illustrative of the general principles of the invention. Various modifications will be apparent to a worker in the art which do not depart from the spirit and scope of the invention. While the invention has been described for the preparation of the more popular n-channel MOS transistor, it can be readily adapted to the fabrication of p-channel MOS, C-MOS transistors, or field effect transistors such as junction field effect transistor (J-FETS) by suitable choice of the dopants used and appropiate processing. Moreover such dopings may be done at stages of the processing other than as described in the illustrative embodiment. Additionally, a variety of known techniques are available for each of the steps involved consistent with the invention. In addition, it may prove feasible to substitute other materials for the silicon nitride and even for the silicon dioxide to a limited extent. Still further, the semiconductor body can be gallium arsenide and ternary and quaternary compounds of III-V compounds such as InGaAs and AlGaInP with the process modified to be consistent with the processing requirements of these materials. For example, the structure could comprise GaAs grown on a CVD layer of SiN. Still further, the hole in silicon dioxide layer 14 need not be completely filled with grown silicon.

The embodiments of the invention in which an exclusive property or privilege is claimed are defined as follows:

1. A process for forming an MOS transistor comprising the steps of:
   forming an insulator layer over a surface of a semiconductor body;
   forming a hole in the layer for exposing a portion of the surface of the semiconductor body;
   growing epitaxially semiconductor material from the exposed portion of the surface of the semiconductor body vertically upward in the hole;
   removing portions of the insulator layer to expose an opposed pair of vertical sidewall portions of the vertically grown semiconductor material;
   growing epitaxially semiconductor material substantially only laterally from said opposed pair of exposed sidewall portions of the vertically grown semiconductor material;
   forming a gate region over a top portion of the vertically grown semiconductor material and using the gate region as a mask to form self-aligned source and drain regions in the laterally grown semiconductor material regions; and
   forming a transistor using the gate region, the two laterally grown silicon portions as source and drain regions and the portion of the vertically grown semiconductor material intermediate between the laterally grown portions as a channel.

2. The process of claim 1 wherein the semiconductor material is silicon, and the upper surface of the vertically grown silicon is covered with a layer of silicon oxide before lateral epitaxial deposition.

3. The process of claim 2 in which the gate region is an oxide-insulated polycrystalline silicon region formed over the top of a portion of the vertically grown silicon.

4. The process of claim 3 in which the silicon oxide layer is removed from the vertically grown silicon at sidewall portions intermediate between end walls of the vertically grown silicon whereby the laterally grown silicon regions interface with the vertically grown silicon only over said intermediate sidewall portions.

5. The process of claim 4 in which an oxide-insulated polycrystalline silicon gate region is used as a mask to allow doping of the two laterally grown silicon portions to adapt same to serve as the source and drain, respectively, of the transistor.

6. The process of claim 5 in which silicide regions are formed over the top of the gate region and over the portions of said laterally grown regions distant from said gate region and electrical connections are provide to such silicide regions.

7. The process of claim 6 wherein the vertically grown silicon is essentially monocrystalline silicon.

8. A process for making an MOS transistor comprising the steps of:
   forming an oxide layer over a surface of a monocrystalline silicon substrate of one conductivity type;
   forming a hole in the oxide which exposes an enclosed portion of the substrate surface;
   filling the hole to the approximate level of the oxide layer with substantially epitaxial vertically grown silicon;
   covering the top surface of the grown silicon with silicon oxide exposing a pair of opposed sidewalls on the grown silicon;
   growing laterally from said opposed sidewalls a pair of opposed regions of epitaxially grown silicon, said regions being supported by regions of the oxide layer and being capped at opposite ends by regions of said oxide layer;
   forming an oxide-insulated polysilicon layer over the top surface of the vertically grown silicon and shaping it for use as the gate region of the transistor over the region intermediate between the two laterally grown regions;
   implanting the laterally grown regions with dopants which cause the laterally grown regions to have the opposite conductivity type;
   using the sidewall spacer technique to cover the sidewalls of the polysilicon electrode and the upper portions of the laterally grown regions for forming regions of a silicide layer selectively over only the top surface of the polysilicon electrode and the lower surfaces of the laterally grown regions; and
   providing electrical connections to the regions of the silicide layer.

9. A process for forming a semiconductor device comprising the steps of:
   forming an insulating layer over a surface of a semiconductor body;
   forming a hole in the insulator layer for exposing a portion of the surface of the semiconductor body;
   growing epitaxially semiconductor material from the exposed portion of the surface of the semiconductor body vertically upward in the hole;
   removing portions of the insulator layer to expose an opposed pair of vertical sidewall portions of the vertically grown semiconductor material; and
   growing epitaxially semiconductor material laterally from said opposed pair of exposed sidewall portions of the vertically grown semiconductor material to form first and second regions which are separated by portions of vertically grown semiconductor material which serve as a third region of the device.

* * * * *